United States Patent

Kunimune et al.

Patent Number: 5,300,627
Date of Patent: Apr. 5, 1994

[54] ADHESIVE POLYIMIDE FILM

[75] Inventors: Kouichi Kunimune, Ichiharashi; Yoshihiro Soeda, Yokohamashi; Setsuo Itami; Kazutsune Kikuta, both of Ichiharashi, all of Japan

[73] Assignee: Chisso Corporation, Osaka, Japan

[21] Appl. No.: 944,968

[22] Filed: Sep. 15, 1992

[30] Foreign Application Priority Data

Oct. 17, 1991 [JP] Japan .................. 3-298333
May 11, 1992 [JP] Japan .................. 4-144890

[51] Int. Cl.⁵ ............... C08G 69/26; C08G 73/10
[52] U.S. Cl. ....................... 528/353; 528/26; 528/28; 528/33; 528/38; 528/125; 528/128; 528/170; 528/172; 528/173; 528/176; 528/183; 528/185; 528/188; 528/220; 528/224; 528/229; 528/350; 528/351; 428/446; 428/447; 428/450; 428/473.5; 428/475.2
[58] Field of Search ......... 528/353, 28, 26, 33, 528/38, 125, 128, 170, 172, 173, 176, 183, 185, 188, 220, 224, 229, 350, 351; 428/473.5, 446, 447, 450, 475.2

[56] References Cited

U.S. PATENT DOCUMENTS

| | | | |
|---|---|---|---|
| 4,748,228 | 5/1988 | Shoji | 528/26 |
| 4,795,680 | 1/1989 | Rich | 525/432 |
| 4,931,539 | 6/1990 | Hayes | 528/229 |
| 4,959,437 | 9/1990 | Kunimune | 528/229 |
| 4,960,846 | 10/1990 | Burgess | 528/26 |
| 4,968,757 | 11/1990 | Lee | 528/26 |
| 4,970,283 | 11/1990 | Kunimune | 528/26 |
| 4,975,331 | 12/1990 | Burgess | 528/26 |
| 4,981,940 | 1/1991 | Konotsune | 528/26 |
| 5,028,681 | 7/1991 | Peters | 528/26 |
| 5,061,774 | 10/1991 | Pank | 528/26 |
| 5,063,115 | 11/1991 | Merriman, Jr. | 528/26 |
| 5,094,919 | 3/1992 | Yamada | 528/26 |
| 5,149,762 | 9/1992 | Murashige | 528/26 |
| 5,157,107 | 10/1992 | Nikaido | 528/26 |

*Primary Examiner*—John Kight, III
*Assistant Examiner*—P. Hampton-Hightower
*Attorney, Agent, or Firm*—Fred Philpitt

[57] ABSTRACT

A silicon-modified, adhesive polyimide film composed mainly of the repetition units of the formula (I) and a process for producing a polyimide film composite product using the above film are provided, the formula (I) being

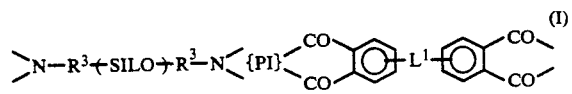

wherein $L^1$ is —O— or —CO—
$R^3$ represents

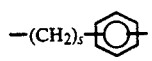 (II)

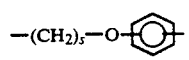

(III)

—(CH$_2$)$_s$—    or    (IV)

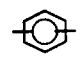

(V)

(S: 1-4), (SILO) is $$-Si\{R^5_{(3-m)}\}\{O_{(m-1)/2}\}-O-Si\{R^5_{(3-m)}\}\{O_{(m-1)/2}\}-$$    (VI)

($R^5$: 1-6C alkyl, phenyl or alkyl-substituted phenyl of 7-12C; m: $1 < m \leq 3$),
(PI) is

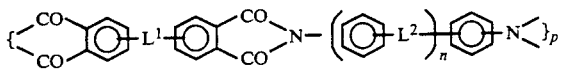

or

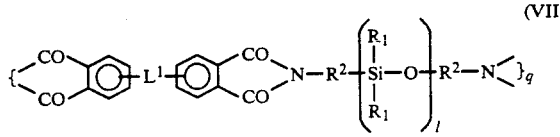 (VII)

($L^2$ is —O— or —CH$_3$; $R^1$ may be same as $R^5$; $R^2$ may be same as $R^3$;

(Abstract continued on next page.)

ABSTRACT
-continued l: $1 \leq l \leq 100$; n: $1 \leq n \leq 3$), and $p$ and $q$ satisfy $$0.1 \leq \frac{q}{p+q} \leq 1 \qquad (VIII)$$

$$0.01 \leq \frac{2}{p+q+2} \leq 0.5), \text{ and} \qquad (IX)$$

the above process for producing a polyimide film composite product comprising subjecting the above-silicon-modified polyimide film to contact-bonding on heating to a material to be adhered, at an ultimate curing temperature of 130°–230° C.

The above polyimide film is highly adhesive and heat-resistant in spite of heating at a relatively low temperature.

3 Claims, No Drawings

ADHESIVE POLYIMIDE FILM

BACKGROUND OF THE INVENTION

Field of the Invention

This invention relates to an adhesive polyimide film which is curable at low temperatures and heat-resistant, and a process for producing the same.

Description of the Related Art

Hot-melt-adhesive films have so far been broadly used in electronics-related fields, for adhesion of bases of printed wiring boards to circuit-bases, adhesion at the time of preparing multi-plies of flexible printed wiring boards, or the like. In these fields, resins of epoxy group, urethane group, polyester group, nitrile rubber group, acrylic group, etc. have been investigated. However, since these resins have not always had a sufficient heat-resistance, polyimide resins have been investigated in the aspect of heat-resistance.

Since polyimide resins require high-temperature heating at the time of adhesion thereof, effort for lowering the heating temperature has been continued. For example, use of polyimides having a specified structure (Japanese patent application laid-open No. Hei 2-180980), a process for adding bismaleimides, epoxy resins or the like to polyimides having a specified structure to lower the softening point of the resins (Japanese patent application laid-open Nos. Sho 62-30122, Sho 62-232475, Sho 62-235382, Sho 62-235383, Hei 1-289862, Hei 2-124971, Hei 2-138788, Hei 2-138789, Hei 2-151681, Hei 2-158681, Hei 2-204029, Hei 2-274762, Hei 3-14890, etc.), etc. have been proposed.

However, these processes have also raised various problems such as insufficient reduction in the softening point, damage to heat-resistance of polyimides, etc.

SUMMARY OF THE INVENTION

The present inventors have made extensive research, and as a result, have found that a polyimide film obtained from at least one kind of tetracarboxylic dianhydrides, at least one kind of diamines, at least one kind of diaminosiloxanes and at least one kind of aminosilanes, each having a specified structure, has a high adhesiveness even if the film is subjected to contact bonding on heating at relatively low temperature, and have achieved the present invention. As apparent from the foregoing, the object of the present invention is to provide a polyimide film having solved the above-mentioned problems and having a high adhesiveness even when the film has been subjected to contact bonding on heating at relatively low temperatures, by using a siliconpolyimide having a specified structure, and a process for producing the above polyimide film.

The present invention has the following constitutions (1)–(9):

(1) A silicon-modified, adhesive polymide film composed mainly of the repetition units expressed by the formula (I):

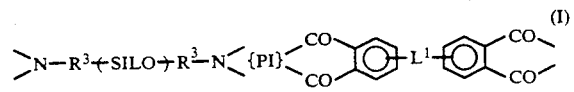

wherein $L^1$ independently represents —O—, —CO—, —SO$_2$— —S— or —C(R$^4$)$_2$— wherein R$^4$ represents —CH$_3$—, —CH$_3$ or H;

R$^3$ independently represents either one of the groups expressed by the formulas (II) to (V):

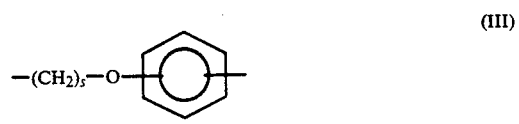

wherein s represents an integer of 1 to 4;
(SILO) is expressed by the formula (VI)

$$-Si\{R^5(3-m)\}\{O(m-1)/2\}-O-Si\{R^5(3-m)\}\{O(m-1)/2\}-$$  (VI)

wherein R$^5$ independently represents an alkyl group of 1 to 6 carbon atoms, phenyl group or an alkyl-substituted phenyl group of 7 to 12 carbon atoms, and m falls in a range of $1 < m \leq 3$;
(PI) is expressed by the formulas (VII)

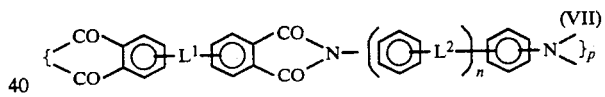

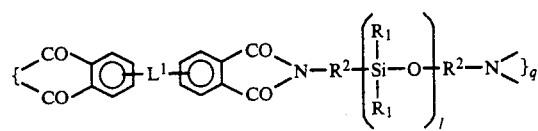

wherein L$^2$ independently represents —O—, —CO—, —SO$_2$—, —S— or —C(R$^4$)$_2$— wherein R$^4$ represents —CH$_3$—, —CF$_3$ or H, R$^1$ independently represents an alkyl group of 1 to 6 carbon atoms, phenyl group or an alkyl-substituted phenyl group of 7 to 12 carbon atoms,
R$^2$ independently represents either one of groups expressed by the formulas (II) to (V), l falls in a range of $1 \leq l \leq 100$, n falls in a range of $1 \leq n \leq 3$, and p and q each fall in the ranges expressed by the formulas (VIII) and (IX):

$$0.1 \leq \frac{q}{p+q} \leq 1$$  (VIII)

$$0.01 \leq \frac{2}{p+q+2} \leq 0.5$$  (IX)

(2) A polyimide film according to item 1, wherein L$^2$ represents —C(CH$_3$)$_2$— and n represents 2 in the formula (VII).

(3) A polyimide film according to item 1, wherein $L^2$ represents —O— and n represents 2 in the formula (VII).

(4) A polyimide film according to item 1, wherein $R^3$ represents a structure expressed by the formula (V) and m represents 3 in the formulas (I) and (VI).

(5) A polyimide film according to item 1, wherein $L^1$ represents —O—, $L^2$ represents —C(CH$_3$)$_2$— and n represents 2 in the formulas (I) and (VII).

(6) A process for producing an adhesive polyimide film, which comprises blending A mols of at least one kind of tetracarboxylic dianhydrides expressed by the formula (X)

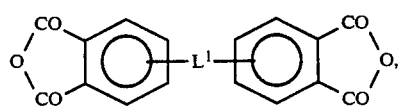  (X)

B mols of at least one kind of diamines expressed by the formula (XI)

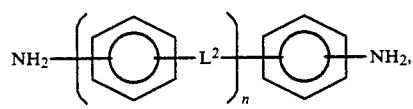  (XI)

C mols of at least one kind of diaminosiloxanes expressed by the formula (XII)

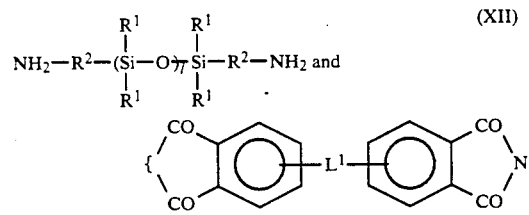  (XII)

D mols of at least one kind of aminosilanes expressed by the formula (XIII)

$NH_2—R^3—Si\{R^5(3-m)\}(Xm)$  (XIII), in the presence of an organic solvent and under conditions satisfying the formula (XIV) relative to said B and C $$0.1 \leq \frac{C}{B+C} \leq 1 \quad \text{and}$$  (XIV)

the formula (XV) relative to said B,C and D $$0.01 \leq \frac{D}{B+C+D} \leq 0.5,$$  (XV)

in the above formulas (X) to (XIII), $L^1$ and $L^2$ each independently representing —O—, —CO—, —SO$_2$—, —S— or —C(R$^4$)$_2$— wherein $R^4$ represents —CH$_3$, —CF$_3$ or H; $R^1$ and $R^5$ each representing an alkyl group of 1 to 6 carbon atoms, phenyl group or an alkyl-substituted phenyl group of 7 to 12 carbon atoms; $R^2$ and $R^3$ each independently representing any one of groups expressed by the formulas (II) to (V); 1 falling in a range of $1 \leq l \leq 100$, m falling in a range of $1 < m \leq 3$; and X independently representing an alkoxy group, an acetoxy group or a halogen atom, followed by reacting the resulting blend at a temperature of 0° to 150° C., coating the resulting polyimide precursor solution onto a substrate, thereafter heating and curing the resulting material.

(7) A process for producing an adhesive polyimide film according to item (6), except that said diamine is replaced by an amine expressed by the formula

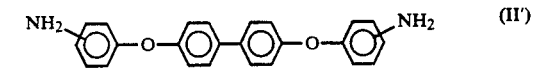  (II')

(8) A process for producing a polyimide film composite product, which comprises subjecting a silicon-modified polyimide film composed mainly of the repetition units expressed by the formula (I) as set forth in item (1), to contact-bonding on heating to a material to be adhered thereonto, at an ultimate curing temperature of 130° to 230° C.

(9) A process for producing a polyimide film composite product according to item (8), wherein said (PI) is expressed by the following formulas:

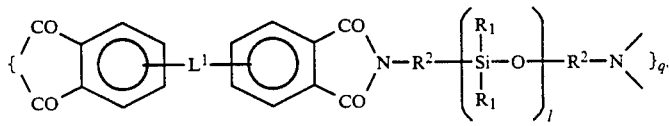

or

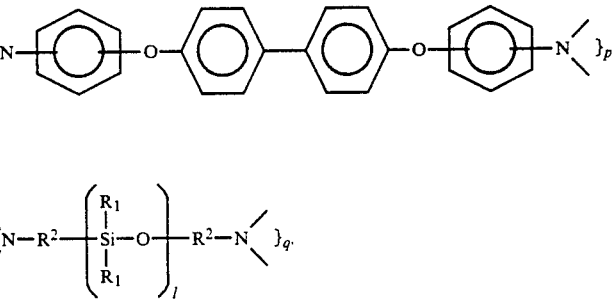

DETAILED DESCRIPTION OF PREFERRED EMBODIMENTS

Firstly, a process for producing a polyimide precursor solution affording the highly adhesive polyimide film of the present invention will be described. The polyimide precursor solution used in the present invention is obtained by reacting at least one kind of tetracarboxylic dianhydrides, at least one kind of diamines, at least one kind of diaminosiloxanes and at least one kind of aminosilanes, respectively expressed by the above formulas (X) to (XIII), in an organic solvent.

Next, raw materials used for producing the polyimide precursor solution will be mentioned.

As concrete examples of the tetracarboxylic dianhydride expressed by the above formulas (X), the following compounds may be exemplified, but it is not always limited thereto:

3,3',4,4'-benzophenonetetracarboxylic dianhydride,
2,3,3',4'-benzophenonetetracarboxylic dianhydride, 2,2',3,3'-benzophenonetetracarboxylic dianhydride,
bis(3,4-dicarboxyphenyl)-ether dianhydride,
bis(2,3-dicarboxyphenyl)-ether dianhydride,
2,3,3',4'-tetracarboxybiphenyl-ether dianhydride,
bis(3,4-dicarboxyphenyl)-sulfone dianhydride,
2,2-bis(3,4-dicarboxyphenyl)-hexafluoropropane dianhydride,
bis(3,4-dicarboxyphenyl)-sulfide dianhydride,
bis(3,4-dicarboxyphenyl)-methane dianhydride,
2,2-bis(3,4-dicarboxyphenyl)-propane dianhydride, etc.

However, known tetracarboxylic dianhydrides other than the compounds expressed by the above formula (X) may be used in a quantity of 20% by mol or less based upon the total quantity of tetracarboxylic dianhydrides used in the reaction. Concrete examples of the other tetracarboxylic dianhydrides are as follows:
pyromellitic dianhydride,
3,3',4,4'-biphenyltetracarboxylic dianhydride,
2,2',3,3'-biphenyltetracarboxylic dianhydride,
2,3,3',4'-biphenyltetracarboxylic dianhydride,
2,3,6,7-naphthalenetetracarboxylic dianhydride,
cyclobutanetetracarboxylic dianhydride,
methylcyclobutanetetracarboxylic dianhydride, and
1,2,3,4-tetracarboxybutane dianhydride.

Examples of the diamine expressed by the formula (XI) are as follows, but it is not always limited thereto:

NH$_2$—⟨○⟩—C(CH$_3$)$_2$—⟨○⟩—NH$_2$

NH$_2$—⟨○⟩—C(CH$_3$)$_2$—⟨○⟩—C(CH$_3$)$_2$—⟨○⟩—NH$_2$

NH$_2$—⟨○⟩—O—⟨○⟩—C(CH$_3$)$_2$—⟨○⟩—O—⟨○⟩—NH$_2$

NH$_2$—⟨○⟩—O—⟨○⟩—O—⟨○⟩—O—⟨○⟩—NH$_2$

NH$_2$—⟨○⟩—CO—⟨○⟩—NH$_2$

NH$_2$—⟨○⟩—O—⟨○⟩—CO—⟨○⟩—O—⟨○⟩—NH$_2$

NH$_2$—⟨○⟩—S—⟨○⟩—NH$_2$

NH$_2$—⟨○⟩—S—⟨○⟩—S—⟨○⟩—S—⟨○⟩—NH$_2$

NH$_2$—⟨○⟩—SO$_2$—⟨○⟩—NH$_2$

NH$_2$—⟨○⟩—O—⟨○⟩—SO$_2$—⟨○⟩—O—⟨○⟩—NH$_2$

NH$_2$—⟨○⟩—CH$_2$—⟨○⟩—NH$_2$

NH$_2$—⟨○⟩—C(CF$_3$)$_2$—⟨○⟩—NH$_2$

NH$_2$—⟨○⟩—O—⟨○⟩—C(CF$_3$)$_2$—⟨○⟩—O—⟨○⟩—NH$_2$

NH$_2$—⟨○⟩—O—⟨○⟩—S—⟨○⟩—O—⟨○⟩—NH$_2$

However, known diamines other than the diamines expressed by the formula (XI) may be used in a quantity of 20% by mol or less based upon the total quantity of diamines used in the reaction.

Concrete examples of the other diamines are as follows:
o-phenylenediamine,
m-phenylenediamine,
p-phenylenediamine,
1,5-diaminonaphthalene,
1,8-diaminonaphthalene,
1,4-diaminotoluene,
methoxylylenediamine,
2,2'-dimethylbenzidine,
trimethylenediamine,
tetramethylenediamine,
hexamethylenediamine,
4,4-dimethylheptamethylenediamine,
2,11-dodecanediamine,
bis-(p-aminophenoxy)dimethylsilane,
1,4-bis(3-aminopropyldimethylsilyl)benzene,
1,4-diaminocyclohexane,
bis(4-aminocyclohexyl)methane,
isophoronediamine,
acetoguanamine, and
benzoguanamine.

Examples of the diamine expressed by the formula (II') are as follows, but it is not always limited thereto:

NH$_2$—⟨○⟩—O—⟨○⟩—⟨○⟩—O—⟨○⟩—NH$_2$

NH$_2$—⟨○⟩—O—⟨○⟩—⟨○⟩—O—⟨○⟩—NH$_2$

Examples of the diaminosiloxane expressed by the formula (XII) are as follows, but it is not always limited thereto:

NH$_2$—(CH$_2$)$_3$—(Si(CH$_3$)$_2$—O)$_r$—Si(CH$_3$)$_2$—(CH$_2$)$_3$—NH$_2$

NH$_2$—(CH$_2$)$_4$—(Si(CH$_3$)$_2$—O)$_r$—Si(CH$_3$)$_2$—(CH$_2$)$_4$—NH$_2$

NH$_2$—⟨○⟩—(Si(CH$_3$)$_2$—O)$_r$—Si(CH$_3$)$_2$—⟨○⟩—NH$_2$

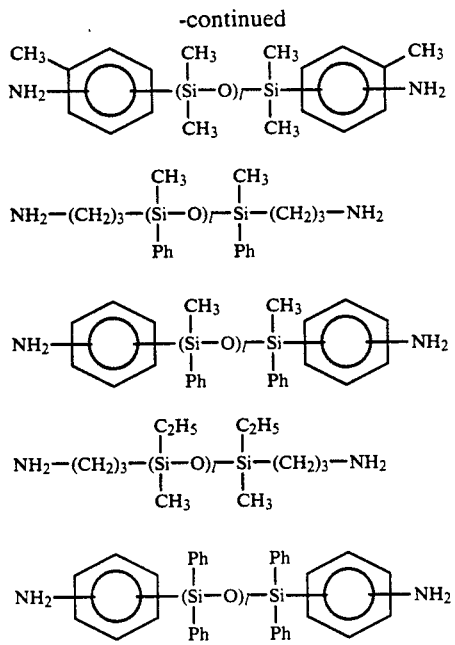

Examples of the aminosilane expressed by the formula (XIII) are as follows, but it is not always limited thereto:

aminomethyl-di-n-propoxy-methylsilane,
($\beta$-amino ethyl)-di-n-propoxy-methylsilane,
($\beta$-aminoethyl)-diethoxy-phenylsilane,
($\beta$-aminoethyl)-tri-n-propoxysilane,
($\beta$-aminoethyl)-dimethoxy-methylsilane,
($\gamma$-aminopropyl)-di-n-propoxy-methylsilane,
($\gamma$-aminopropyl)-di-n-butoxy-methy,lsilane,
($\gamma$-aminopropyl)trimethoxysilane,
($\gamma$-aminopropyl)triethoxysilane,
($\gamma$-aminopropyl)-di-n-pentoxy-phenylsilane,
($\gamma$-aminopropyl)-methoxy-n-propoxy-methylsilane,
($\delta$-aminobutyl)-dimethoxy-methylsilane,
(3-aminophenyl)-di-n-propoxysilane,
(4-aminophenyl)-tri-n-propoxysilane,
{$\beta$-(4-aminophenyl)-ethyl}-diethoxy-methylsilane,
{$\beta$-(3-aminophenyl)-ethyl}-di-n-propoxy-phenylsilane,
{$\gamma$4-aminophenyl)-propyl}-di-n-propoxy-methylsilane,
{$\gamma$4-aminophenoxy)-propyl}-di-n-propoxy-methylsilane,
{$\gamma$-(3-aminophenoxy)-propyl}-di-butoxy-methylsilane,
{$\gamma$-(3-aminophenoxy)-propyl}-di-methyl-dimethoxysilane,
($\gamma$-aminopropyl)-methyl-diethoxysilane,
($\gamma$-aminopropyl)-ethyl-di-n-propoxysilane,
(4-aminophenyl)-trimethoxysilane,
(3-aminophenyl)-trimethoxysilane,
(4-aminophenyl)-methyl-dimethoxysilane,
(3-aminophenyl)-dimethyl-methoxysilane, and
(4-aminophenyl)-triethoxysilane.

Examples of the diaminosiloxane expressed by the formula (XII) are as follows, but it is not always limited thereto:

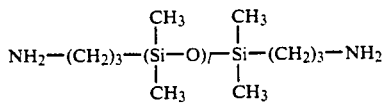

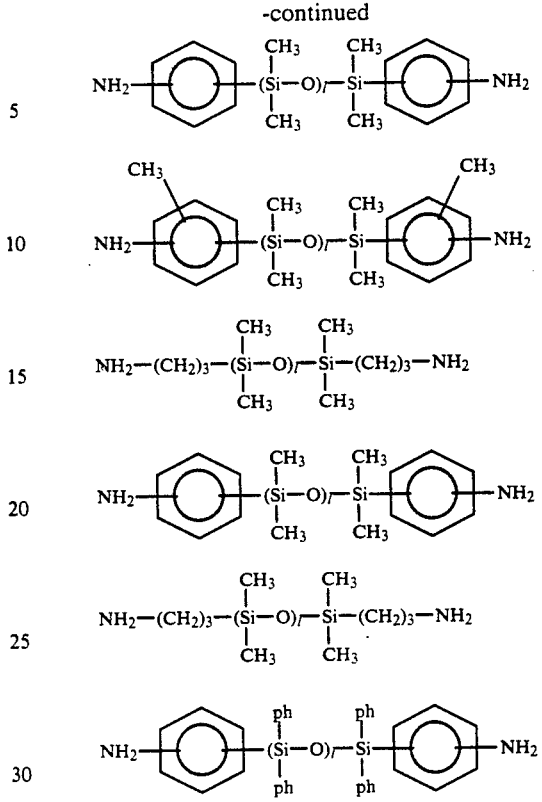

Examples of solvent preferred for reacting the above raw material compounds in a solvent (hereinafter referred to as reaction solvent) are as follows:
N-methyl-2-pyrrolidone, N,N-dimethylacetamide, N,N-dimethylformamide, dimethylsulfoxide, tetramethylurea, pyridine, hexamethylphosphoroamide, methylformamide, N-acetyl-2-pyrrolidone, 2-methoxyethanol, 2-ethoxyethanol, 2-butoxyethanol, diethylene glycol monomethyl ether, diethylene glycol monoethyl ether, diethylene glycol monobutyl ether, cyclopentanone, cyclohexanone, cresol, $\gamma$-butyrolactone, isophorone, N,N-diethylacetamide, N,N-diethylformamide, N,N-dimethylmethoxyacetamide, tetrahydrofuran, N-methyl-$\epsilon$-caprolactam, and tetrahydrothiophene dioxide (sulfolane).

Further, this reaction may also be carried out in a mixed solvent obtained by mixing the above organic solvents. Further, it is possible to use solvents obtained by diluting the above preferred solvents with other aprotic (neutral) organic solvents such as aromatic, alicyclic or aliphatic hydrocarbons or chlorinated derivatives thereof (e.g. benzene, toluene, xylenes, cyclohexane, pentane, hexane, petroleum ether, methylene chloride, etc.) or dioxane, etc.

Next, a process for producing the polyimide precursor solution used in the present invention will be described.

The above-mentioned tetracarboxylic dianhydride, diamine, diaminosiloxane and aminosilane are reacted in an organic solvent in a conventional manner. As to the mixing ratio of these raw materials, mixing is carried out in a ratio of the above formulas (XIV) and (XV). The ratio of the formulas (XIV) expresses preferable ones of diamine to diaminosiloxane. In the mixing ratio outside the ranges, it is impossible to obtain a polyimide film having a superior adhesiveness at low temperatures.

The formula (XV) expresses the preferable ranges of the aminosilane in the total amines.

If the proportions of the aminosilane are less than the above ranges, the strength of the resulting film is often low or its adhesion strength is often low. To the contrary, if the proportions of the aminosilane exceed the above ranges, the resulting film is brittle and the adhesion strength is also low. The proportion of the total amines to the tetracarboxylic dianhydride is preferably about equimolecular. However, if the proportion falls within a range of 10% or less, it does not matter even if either one of them is in excess.

As to any one of the tetracarboxylic dianhydride, diamine, diaminosilane and aminosilane used as raw materials, it is possible to use two kinds or more thereof. The reaction is carried out in an organic solvent and the polymer concentration at that time is preferably 60% by weight or less, and particularly preferably 10 to 40% by weight for practical use. The addition order of the respective raw materials may be any order.

For example, the total quantity of the diamine is reacted with the tetracarboxylic dianhydride in a nearly equimolar quantity thereto, followed by reacting the total quantity of the diaminosiloxane with the tetracarboxylic dianhydride in a nearly equimolar quantity thereto and then reacting the tetracarboxylic dianhydride in the residual quantity with the total quantity of the aminosilane, to afford a block copolymer. Whereas, when the respective raw material components are at the same time added and reacted together, it is possible to obtain a random copolymer. It is also possible to obtain a polymer having an intermediate structure between the above two.

The reaction temperature is preferably 0° to 150° C. If the reaction temperature is low, the resulting polymer is a polyamic acid, and with increase of the reaction temperature, the proportion of imide group in the polymer increases. If the reaction temperature exceeds 150° C., the polymer often becomes insoluble or gels. The reaction time is several tens minutes to several tens hours, and about 1 to 30 hours are particularly preferable.

The thus obtained polyimide precursor solution is cast on a substrate, heated and cured to obtain the adhesive polyimide film of the present invention. The solvent is vaporized off by heating and at the same time, the amic acid is imidized. Thus, the heating temperature is preferably about 60° to 200° C. In the case where the polymer in the solution has been almost imidized, the heating temperature may be low, but in the case where it is amic acid, a somewhat high heating temperature is necessary.

In order to complete the imidization, a promotor for imidization such as a tertiary amine may be also added. At the time of heating, hydrolyzable groups present at the terminal of the polymer such as alkoxy group, acetoxy group, halogen, etc. react and cross-linking occurs by siloxane condensation reaction to form a high molecular weight polymer. After heating, in the case where the film is difficult to be peeled from the substrate, when the film is peeled from the substrate after heating at a somewhat low temperature, followed by fixing the film and heating it at a further high temperature, then the above difficulty can be avoided.

When the adhesive polyimide film of the present invention is subjected to contact bonding on heating onto a material to be adhered, it is possible to obtain a composite product. The heating temperature at that time is about 100° to 350° C., but in order to afford a practically sufficient adhesion strength, a heating temperature of 130° C. or higher is preferable, and in order not to degenerate the material to be adhered, a somewhat low heating temperature is preferable. In such an aspect, in the case of the adhesive polyimide film of the present invention, a heating temperature of 130° to 230° C. is particularly preferable.

The adhesive polyimide film of the present invention has a superior adhesiveness onto copper foil and polyimide films even at a low temperature; hence it is broadly applicable not only to electronics-related fields such as adhesion of substrate of printed wiring board to circuit substrate, adhesion at the time of preparing a multi-ply board of flexible printed wiring board, etc., but also as bonding film or sheet.

The present invention will be described in more detail by way of Examples and Comparative examples, but it should not be construed to be limited thereto.

EXAMPLE 1

Into a 1 l flask provided with a stirrer, a thermometer, a condenser and a nitrogen gas-introducing tube and purged with nitrogen gas were fed diethylene glycol dimethyl ether (hereinafter abbreviated to "diglyme") (344 g), N,N-dimethylacetamide (hereinafter abbreviated to "DMAC") (40 g) and ethanol (16 g).

Next, 3,3'-diaminodiphenylsulfone (hereinafter abbreviated to "DDS") (18.94 g, 0.0764 mol), ω,ω'-bisaminopropylpolydimethylsiloxane (hereinafter abbreviated to "FM"; M.W. 814) (155.38 g, 0.191 mol), 3-aminopropyltriethoxysilane (hereinafter abbreviated to "APS-E") (3.66 g, 0.0166 mol) and 3,3',4,4'-benzophenonetetracarboxylic dianhydride (hereinafter abbreviated to "BTDA") (89.02 g, 0.276 mol) were added and reacted at 40° C. for 10 hours to obtain a polyimide precursor solution.

This solution was uniformly coated onto a polyester film by means of a coater, followed by drying the resulting material in an oven at 150° C. for one hour to obtain a polyimide film of about 30 μm thick of the present invention.

EXAMPLE 2

Employing the same apparatus and process as in Example 1, diglyme (344 g), DMAC (40 g), ethanol (16 g), BTDA (86.22 g, 0.268 mol) and FM (M.W.: 814) (153.07 g, 0.188 mol) were mixed, followed by reacting them at 30° C. for 5 hours, thereafter adding 1,4-bis(α,α-dimethyl, p-aminobenzyl)benzene (hereinafter abbreviated to "BABB") (25.91 g, 0.0752 mol) and APS-E (1.78 g, 0.00805 mol) and further reacting the mixture at 40° C. for 10 hours, to obtain a polyimide precursor solution.

This solution was similarly coated, followed by drying at 150° C., for one hour, to obtain a polyimide film of about 30 μm thick of the present invention.

EXAMPLE 3

Employing the same apparatus and process as in Example 1, diglyme (200 g), DMAC (200 g), 4,4'-oxydiphthalic dianhydride (hereinafter abbreviated to "ODPA") (82.3 g, 0.265 mol) and 1,3-bis(4-aminophenoxy)benzene (hereinafter to "TPE-R") (16.28 g, 0.0558 mol) were mixed, followed by reacting the mixture at 30° C. for 3 hours, thereafter adding FM (M.W.: 814) (166.40 g, 0.204 mol) and 4-aminophenyltrimethoxysilane (hereinafter abbreviated to "APMS") (2.03 g, 0.0953 mol) and further reacting the mixture at 50° C. for 10 hours, to obtain a polyimide precursor solution.

This solution was similarly coated, followed by drying at 150° C. for one hour, to obtain a polyimide film of about 30 μm thick of the present invention.

EXAMPLE 4

Employing the same apparatus and process as in Example 1, diglyme (320 g), DMAC (40 g), ethanol (40 g), ODPA (80.31 g, 0.259 mol), 2,2-bis{4-(4-aminophenoxy)phenyl}propane (13.68 g, 0.0333 mol), FM (M.W.: 814) (162.68 g, 0.200 mol) and APS-E (30 g, 0.0466 mol) were mixed, followed by reacting the mixture at 20° C. for 24 hours, to obtain a polyimide precursor solution.

This solution was similarly coated, followed by drying at 150° C. for one hour, to obtain a polyimide film of about 30 μm thick of the present invention.

EXAMPLE 5

Employing the same apparatus and process as in Example 1, diglyme (200 g), DMAC (200 g), ODPA (77,85 g, 0.251 mol), BABB (48.55 g, 0.141 mol), FM (M.W.: 1,530) (161.94 g, 0.105 mol) and APMS (1.60 g, 0.00751 mol) were mixed, followed by reacting the mixture at 50° C. for 15 hours, to obtain a polyimide precursor solution. This solution was similarly coated, followed by drying at 150° C., for one hour, to obtain a polyimide film of about 30 μm thick of the present invention.

EXAMPLE 6

Employing the same apparatus and process as in Example 1, diglyme (344 g), DMAC (40 g), ethanol (16 g), diphenylsulfone-3,3',4,4'-tetracarboxylic dianhydride (82.81 g, 0.231 mol), bis{4-(4-aminophenoxy)phenyl}sulfone (56.34 g, 0.130 mol), FM (M.W.: 1,530) (149.50 g, 0.0977 mol) and APS-E (1.31 g, 0.00593 mol) were mixed, followed by reacting the mixture at 35° C. for 10 hours, to obtain a polyimide precursor solution.

This solution was similarly coated, followed by drying at 150° C., for one hour, to obtain a polyimide film of about 30 μm thick of the present invention.

EXAMPLE 7

Employing the same apparatus and process as in Example 1, diglyme (200 g), DMAC (200 g), BTDA (89.45 g, 0.278 mol), 4,4'-diaminodiphenyl sulfide (16.86 g, 0.0781 mol) were mixed, followed by reacting the mixture at 30° C. for 2 hours, thereafter adding FM (M.W.: 814), (158.82 g, 0.195 mol), reacting the mixture for 5 hours, further adding APS-E (1.84 g, 0.0833 mol) and reacting the mixture for 10 hours, to obtain a polyimide precursor solution.

This solution was similarly coated, followed by drying at 150° C., for one hour, to obtain a polyimide film of about 30 μm thick of the present invention.

COMPARATIVE EXAMPLE 1

Employing the same apparatus and process as in Example 1, diglyme (200 g), DMAC (200 g), BTDA (88.24 g, 0.274 mol), DDS (19.42 g, 0.0783 mol) and FM (M.W.: 814) (159.36 g, 0.196 mol) were mixed, followed by reacting the mixture at 40° C. for 10 hours, to obtain a polyimide precursor solution.

This solution was similarly coated, followed by drying at 150° C., for one hour, to obtain a polyimide film of about 30 μm thick.

COMPARATIVE EXAMPLE 2

Employing the same apparatus and process as in Example 1, diglyme (200 g), DMAC (200 g), BTDA (121.46 g, 0.377 mol) and DDS (93.54 g, 0.377 mol) were mixed, followed by reacting the mixture at 40° C. for 10 hours, to obtain a polyimide precursor solution.

This solution was similarly coated, followed by drying at 150° C. for one hour, to obtain a polyimide film of 30 μm thick.

EXAMPLE 8 (PEEL-ADHESION STRENGTH TEST)

The respective polyimide films of 9 kinds prepared in Examples 1 to 7 and Comparative examples 1 and 2 were placed between two copper foils (JICI Ooz., trade name of product made by Nikko Glued Foil Co., Ltd.), followed by subjecting the resulting material to contact bonding for 15 minutes by means of a pressing machine kept at 200° C. under 100 Kg/mm$^2$ to prepare test pieces. The respective one side ends of the upper and lower copper foils of the test pieces (10 mm wide) were pulled at an angle of 180° (tensile speed: 50 mm/min.), to measure the respective strengths by means of a tensile tester (Strograph M50, trademark of product made by Toyoseiki Co., Ltd.).

Further, using polyimide films (Capton 300H, trademark of product made by Toray-Dupont Co., Ltd.) in place of copper foils, the same tests were carried. The results are together shown in Table 1. As seen from the results, the polyimide film of the present invention has a superior adhesiveness.

In addition, for reference, the proportions of raw materials of the polyimides prepared in Examples 1 to 7 and Comparative examples 1 and 2 are together shown in Table 2.

TABLE 1

| Test No. | Varnish | Peel-adhesion strength (Kg/cm) | |
|---|---|---|---|
| | | Copper | Capton |
| 1 | Example 1 | 1.1 | 1.2 |
| 2 | Example 2 | 1.4 | 1.4 |
| 3 | Example 3 | 3.3 | 1.1 |
| 4 | Example 4 | 1.0 | 1.0 |
| 5 | Example 5 | 2.9 | 2.4 |
| 6 | Example 6 | 1.0 | 0.9 |
| 7 | Example 7 | 1.2 | 1.3 |
| 8 | Comp. ex. 1 | 1.0 | 0 |
| 9 | Comp. ex. 2 | 0 | 0 |

TABLE 2

| Example or Comp. ex. | A | B | C | D | $\frac{C}{B+C}$ | $\frac{D}{B+C+D}$ |
|---|---|---|---|---|---|---|
| Example 1 | 0.276 | 0.0764 | 0.191 | 0.0166 | 0.71 | 0.058 |
| Example 2 | 0.268 | 0.0752 | 0.188 | 0.0805 | 0.71 | 0.030 |
| Example 3 | 0.265 | 0.0558 | 0.204 | 0.00953 | 0.79 | 0.035 |
| Example 4 | 0.259 | 0.0333 | 0.200 | 0.0466 | 0.86 | 0.17 |
| Example 5 | 0.251 | 0.141 | 0.105 | 0.00751 | 0.43 | 0.030 |
| Example 6 | 0.231 | 0.130 | 0.0977 | 0.00593 | 0.43 | 0.025 |
| Example 7 | 0.278 | 0.0781 | 0.195 | 0.00833 | 0.71 | 0.030 |

TABLE 2-continued

| Example or Comp. ex. | A | B | C | D | $\frac{C}{B+C}$ | $\frac{D}{B+C+D}$ |
|---|---|---|---|---|---|---|
| Comp. ex. 1 | 0.274 | 0.0783 | 0.196 | 0 | 0.71 | 0 |
| Comp. ex. 2 | 0.377 | 0.377 | 0 | 0 | 0 | 0 |

EXAMPLE 9

Into a 1 l flask provided with a stirrer, a thermometer, a condenser and a nitrogen gas-introducing tube and purged with nitrogen gas, were fed diglyme (344 g), DMAC (40 g) and ethanol (16 g).

Next, 4,4'-bis(4-aminophenoxy)biphenyl (hereinafter abbreviated to "BAPB") (30.85 g, 0.0837 mol), FM (M.W.: 660) (138.19 g, 0.209 mol), APMS (1.90 g, 0.00892 mol) and BTDA (96.05 g, 0.298 mol) were added with stirring, followed by reacting the mixture at 30° C. for 20 hours, to obtain a polyimide precursor solution.

This solution was uniformly coated onto a polyester film by means of a coater, followed by heating the resulting material at 150° C. in an oven for one hour, to obtain a polyimide film of about 30 μm thick of the present invention.

EXAMPLE 10

Employing the same apparatus and process as in Example 9, there were added diglyme (300 g), DMAC (84 g), ethanol (16 g), ODPA (91.75 g, 0.296 mol), BAPB (22.77 g, 0.0618 mol) and FM (M.W.: 660) (149.55 g, 0.227 mol), followed by reacting the mixture at 30° C. for 15 hours, thereafter adding APS-E (294 g, 0.0133 mol) and reacting the mixture at 4° C. for 3 hours to obtain a polyimide precursor solution.

This solution was similarly coated, followed by drying at 150° C., for one hour, to obtain a polyimide film of about 30 μm thick of the present invention.

EXAMPLE 11

Employing the same apparatus and process as in Example 9, diglyme (190 g), DMAC (190 g), ethanol (20 g), diphenylsulfone-3,3',4,4'-tetracarboxylic dianhydride (98.94 g, 0.276 mol) and BAPB (9.05 g, 0.0246 mol) were mixed, followed by reacting the mixture at 30° C. for 2 hours, thereafter adding FM (M.W.: 660) (145.92 g, 0.221 mol) and APMS (13.08 g, 0.0614 mol), and further reacting the mixture at 40° C. for 10 hours, to obtain a polyimide precursor solution.

This solution was similarly coated, followed by drying at 150° C. for one hour to obtain a polyimide film of about 30 μm thick of the present invention.

EXAMPLE 12

Employing the same apparatus and process as in Example 9, DMAC (360 g), ethanol (40 g), hexafluoroisopropylidene-2,2 -bis(phthalic anhydride) (111.92 g, 0.252 mol), BAPB (13.08 g, 0.0355 mol) and FM (M.W.: 660) (140.56 g, 0.213 mol) were mixed, followed by reacting the mixture at 40° C. for 10 hours, thereafter adding APS-E (1.43 g, 0.00647 mol) and further reacting the mixture at this temperature for 5 hours to obtain a polyimide precursor solution.

This solution was similarly coated, followed by drying at 150° C., for one hour, to obtain a polyimide film of about 30 μm thick of the present invention.

EXAMPLE 13

Employing the same apparatus and process as in Example 9, diglyme (100 g), DMAC (300 g), ODPA (70.99 g, 0.229 mol), APMS (1.75 g, 0.00822 mol) and FM ( M.W.: 1,530) (147.06 g, 0.0961 mol) were mixed, followed by reacting the mixture at 50° C. for 10 hours, thereafter adding BAPB (47.21 g, 0.128 mol) and further reacting the mixture at 50° C. for 15 hours, to obtain a polyimide precursor solution.

This solution was similarly coated, followed by drying at 150° C., for one hour, to obtain a polyimide film of about 30 μm thick of the present invention.

EXAMPLE 14

Employing the same apparatus and process as in Example 9, diglyme (190 g), DMAC (200 g), ethanol (10 g), ODPA (94.13 g, 0.303 mol), BAPB (47.11 g, 0.128 mol), methaphenylenediamine (2.30 g, 0.0213 mol), FM (M.W.: 814) (121.45 g, 0.149 mol) and APS-E (2.01 g, 0.00910 mol) were mixed, followed by reacting the mixture at 50° C. for 15 hours, to obtain a polyimide precursor solution.

This solution was similarly coated, followed by drying at 150° C. for one hour, to obtain a polyimide of about 30 μm thick of the present invention.

COMPARATIVE EXAMPLE 3

Employing the same apparatus and process as in Example 9, diglyme (344 g), DMAC (40 g), ethanol (16 g), BAPB (31.26 g, 0.0849 mol), FM (M.W.: 660) (140.02 g, 0.212 mol) and BTDA (95.70 g, 0.297 mol) were mixed, followed by reacting the mixture at 30° C. for 20 hours, to obtain a polyimide precursor solution.

This solution was coated, followed by drying at 150° C. for one hour, to obtain a polyimide film of about 30 μm thick.

COMPARATIVE EXAMPLE 4

Employing the same apparatus and process as in Example 9, DMAC (400 g), BTDA (46.66 g, 0.145 mol) and BAPB (53.34 g, 0.145 mol) were mixed, followed by reacting the mixture at 30° C. for 20 hours, to obtain a polyimide precursor solution.

This solution was coated, followed by drying at 150° C. for one hour, to obtain a polyimide film of about 30 μm thick.

EXAMPLE 15 (PEEL-ADHESION TEST)

The respective polyimide films of 8 kinds prepared in Examples 9 to 14 and Comparative examples 3 and 4 were placed between two copper foils (JICI.Ooz, trade name of product made by Nikko Glued Foil Co., Ltd.), followed by subjecting the resulting material to contact bonding under 100 Kg/mm² for 15 minutes by means of a pressing machine maintained at 200° C., to prepare test pieces.

The respective one side ends of the upper and lower copper foils of the test pieces (10 mm wide) were pulled at an angle of 180° (tensile speed: 50 mm/min.), to measure the respective strengths by means of a tensile tester (Strograph M50, trademark of product made by Toyoseiki Co., Ltd.).

Further, using two sheets of a polyimide film (Capton 300H, trademark of product made by Toray-Dupont Co., Ltd.), in place of copper foils, the same tests were carried out. The results are together shown in Table 3. As seen from these results, the polyimide film has a superior adhesiveness. In addition, for reference, the proportions of raw materials of the polyamides prepared in Examples 9 to 14 and Comparative examples 3 and 4 are together shown in Table 4.

TABLE 3

| Test No. | Varnish | Peel-adhesion strength (Kg/cm) | |
| | | Copper | Capton |
| --- | --- | --- | --- |
| 1 | Example 9 | 1.4 | 1.1 |
| 2 | Example 10 | 1.8 | 1.4 |
| 3 | Example 11 | 0.9 | 1.1 |
| 4 | Example 12 | 1.2 | 1.1 |
| 5 | Example 13 | 1.0 | 1.0 |
| 6 | Example 14 | 1.1 | 0.9 |
| 7 | Comp. ex. 3 | 0.9 | 0 |
| 8 | Comp. ex. 4 | 0 | 0 |

TABLE 4

| Example or Comp. ex. | A | B | C | D | $\frac{C}{B+C}$ | $\frac{D}{B+C+D}$ |
| --- | --- | --- | --- | --- | --- | --- |
| Example 9 | 0.298 | 0.0837 | 0.209 | 0.00892 | 0.71 | 0.030 |
| Example 10 | 0.296 | 0.0618 | 0.227 | 0.0133 | 0.79 | 0.044 |
| Example 11 | 0.276 | 0.0246 | 0.221 | 0.0614 | 0.90 | 0.20 |
| Example 12 | 0.252 | 0.0355 | 0.213 | 0.00647 | 0.86 | 0.17 |
| Example 13 | 0.229 | 0.128 | 0.0961 | 0.00822 | 0.43 | 0.035 |
| Example 14 | 0.287 | 0.121 | 0.161 | 0.00860 | 0.57 | 0.030 |
| Comp. ex. 3 | 0.297 | 0.0849 | 0.212 | 0 | 0.71 | 0 |
| Comp. ex. 4 | 0.145 | 0.145 | 0 | 0 | 0 | 0 |

EFFECTIVENESS OF THE INVENTION

The fields of hot-melt-adhesive films having so far been researched in the electronics-related fields have been directed mainly to resins of epoxy group, urethane group, polyester group, nitrile rubber group or acrylic group, but these resins have a defect in heat resistance. On the other hand, polyimide resins are heat-resistant, but they had a defect that high-temperature heating is necessary at the time of adhesion. According to the present invention, it has become possible to obtain a polyimide film being highly adhesive and heat-resistant in spite of heating at a relatively low temperature. This has a commercially high value.

What we claim is:

1. A silicon-modified, adhesive polyimide film composed mainly of the repetition units expressed by the formula (I):

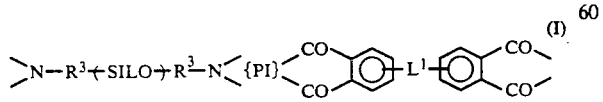 (I)

wherein
L¹ independently represents —O— or —CO—;
R³ independently represents either one of the groups expressed by the formulas (II) to (V):

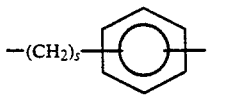 (II)

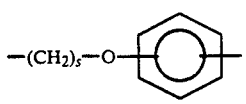 (III)

—(CH₂)ₛ— (IV)

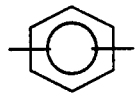 (V)

wherein s represents an integer of 1 to 4;
(SILO) is expressed by the formula (VI)

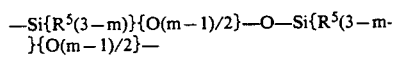 (VI)

wherein $R^5$ independently represents an alkyl group of 1 to 6 carbon atoms, phenyl group or an alkylsubstituted phenyl group of 7 to 12 carbon atoms, and m falls in a range of $1 < m \leq 3$;
(PI) is expressed by the formulas (VII)

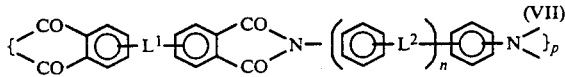 (VII)

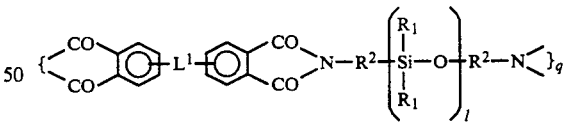

wherein L² independently represents —O—, or —CH₃—, R¹ independently represents an alkyl group of 1 to 6 carbon atoms, phenyl group or an alkylsubstituted phenyl group of 7 to 12 carbon atoms, R² independently represents either one of groups expressed by the formulas (II) to (V), l falls in a range of $1 \leq l \leq 100$, n falls in a range of $1 \leq n \leq 3$, and p and q each fall in the ranges expressed by the formulas (VIII) and (IX):

$$0.1 \leq \frac{q}{p+q} \leq 1 \quad \text{(VIII)}$$

$$0.01 \leq \frac{2}{p+q+2} \leq 0.5 \quad \text{(IX)}$$

2. A process for producing an adhesive polyimide film, which comprises blending A mols of at least one kind of tetracarboxylic dianhydrides expressed by the formula (X)

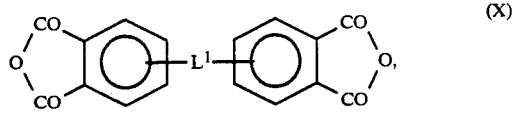
(X)

B mols of at least one kind of diamines expressed by the formula (XI)

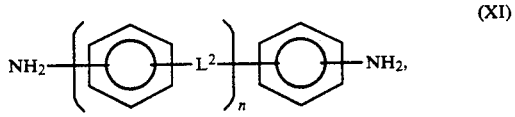
(XI)

C mols of at least one kind of diaminosiloxanes expressed by the formula (XII)

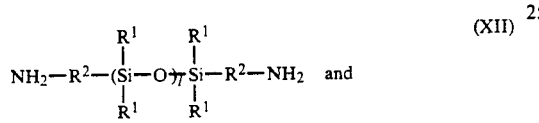
(XII)

and

D mold of at least one kind of aminosilanes expressed by the formula (XIII)

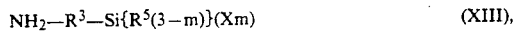

$$NH_2—R^3—Si\{R^5(3-m)\}(Xm) \qquad (XIII),$$

in the presence of an organic solvent, and under conditions satisfying the formula (XIV) relative to said B and C $$0.1 \leq \frac{C}{B+C} \leq 1 \text{ and} \qquad (XIV)$$

the formula (XV) relative to said B, C and D $$0.01 \leq \frac{D}{B+C+D} \leq 0.5, \qquad (XV)$$

in the above formulas (X) to (XIII), L1 represents —O— or —CO—, L2 represents —O— or —CH3; $R^1$ and $R^5$ each representing an alkyl group of 1 to 6 carbon atoms, phenyl group or an alkyl-substituted phenyl group of 7 to 12 carbon atoms; $R^2$ and $R^3$ each independently representing any one of groups expressed by the formulas (II) to (V) set forth in claim 1; l falling in a range of $1 \leq l \leq 100$, m falling in a range of $1 < m \leq 3$; and X independently representing an alkoxy group, an acetoxy group or a halogen atom, followed by reacting the resulting blend at a temperature of 0° to 150° C., coating the resulting polyimide precursor solution onto a substrate, thereafter heating and curing the resulting material.

3. A process for producing a polyimide film composite product, which comprises subjecting a silcon-modified polyimide film composed mainly of the repetition units expressed by the formula (I) as set forth in claim 1, to contact-bonding on heating to a material to be adhered thereonto, at an ultimate curing temperature of 130° to 230° C.

* * * * *